(12) United States Patent
Kelleher et al.

(10) Patent No.: US 8,630,679 B2
(45) Date of Patent: Jan. 14, 2014

(54) WIRELESS COMMUNICATION UNIT, BASEBAND MODULE, RADIO FREQUENCY MODULE, WIRELESS TERMINAL AND COMPUTER PROGRAM PRODUCT

(75) Inventors: Paul Kelleher, Aherla (IE); Conor Okeeffe, Cork (IE); Daniel B Schwartz, Scottsdale, AZ (US); Kevin Traylor, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 518 days.

(21) Appl. No.: 12/600,007

(22) PCT Filed: May 25, 2007

(86) PCT No.: PCT/IB2007/051979
§ 371 (c)(1),
(2), (4) Date: Nov. 13, 2009

(87) PCT Pub. No.: WO2008/146090
PCT Pub. Date: Dec. 4, 2008

(65) Prior Publication Data
US 2010/0311464 A1   Dec. 9, 2010

(51) Int. Cl.
*H04M 1/00* (2006.01)
(52) U.S. Cl.
USPC ....... 455/552.1; 455/86; 455/141; 455/196.1; 455/208; 455/255; 455/259; 455/265; 455/318; 455/553.1
(58) Field of Classification Search
USPC .............. 455/418, 425, 42, 45, 67.11, 85–87, 455/552.1, 553.1, 550.1, 141, 146, 147, 455/208, 255, 258, 259, 318; 713/322, 400, 713/500, 600; 377/78; 327/141, 211, 212, 327/291–299
See application file for complete search history.

(56) References Cited

U.S. PATENT DOCUMENTS

| | | | |
|---|---|---|---|
| 5,553,064 A  * | 9/1996 | Paff et al. | ...... 370/478 |
| 6,690,949 B1 | 2/2004 | Shamlou et al. | |

(Continued)

FOREIGN PATENT DOCUMENTS

| | | |
|---|---|---|
| EP | 1458111 A | 9/2004 |
| GB | 2399966 A | 9/2004 |

(Continued)

OTHER PUBLICATIONS

International Search Report and Written Opinion correlating to PCT/IB2007/051979 dated Nov. 11, 2007.

*Primary Examiner* — Marcos Torres (57) ABSTRACT

A wireless communication unit has two or more communication modes including one or more mobile phone mode, in which mobile phone mode the wireless communication unit is able to transmit or receive wireless signals via an antenna from and/or to a mobile phone network in accordance with a communication protocol. The unit includes a baseband module and a radiofrequency module. A radiofrequency interface of the baseband module is connected to the radiofrequency module, for receiving and/or transmitting baseband signals from and/or to the radiofrequency module. The radiofrequency module includes a baseband interface, for receiving and/or transmitting the baseband signals to the baseband module and an antenna interface (AI) connectable to an antenna for receiving and/or transmitting radiofrequency signals from and/or to the antenna. A clock system is connected to the radiofrequency interface and the baseband interface. The clock system can provide a clock signal with a clock rate of to the radiofrequency interface and the baseband interface in one or more of the one or more mobile phone modes.

18 Claims, 2 Drawing Sheets

(56) References Cited

U.S. PATENT DOCUMENTS

| | | |
|---|---|---|
| 7,116,242 B2 * | 10/2006 | Guthrie ............................ 340/4.3 |
| 2004/0136411 A1 * | 7/2004 | Hornbuckle et al. .......... 370/537 |
| 2004/0258185 A1 * | 12/2004 | Kihara ........................... 375/371 |
| 2005/0119025 A1 * | 6/2005 | Mohindra et al. .......... 455/552.1 |
| 2007/0066261 A1 | 3/2007 | Haralabidis et al. |
| 2008/0137787 A1 * | 6/2008 | Soffer ............................ 375/346 |
| 2009/0138745 A1 * | 5/2009 | Dorsey et al. .................. 713/501 |

FOREIGN PATENT DOCUMENTS

| | | |
|---|---|---|
| WO | 02/13593 A | 2/2002 |
| WO | 02/43260 A | 5/2002 |

\* cited by examiner

WIRELESS COMMUNICATION UNIT, BASEBAND MODULE, RADIO FREQUENCY MODULE, WIRELESS TERMINAL AND COMPUTER PROGRAM PRODUCT

FIELD OF THE INVENTION

This invention relates to a wireless communication unit, a baseband module, a radio frequency module, a wireless terminal and a computer program product.

BACKGROUND OF THE INVENTION

Wireless communication devices, such as mobile phone handsets, typically incorporate a number of distinct and operably coupled sub-systems, in order to provide the wide variety of functions and operations that a complex wireless communication device needs to perform. Interfaces are defined for communicating between the respective sub-systems.

Such sub-systems may include radio frequency power amplification functions, radio frequency integrated circuits comprising radio frequency generation, amplification, filtering logic, etc. as well as baseband integrated circuits (BBIC) comprising audio circuits, encoding/decoding, (de)modulation functions, processing logic, etc. and memory units. Typically, the baseband integrated circuits are provided as one or more baseband modules that can be operably coupled to one or more RF modules in which the RF integrated circuit is implemented.

Wireless communication devices typically have to comply with different communication standards, such as for example those named Global System for Mobile communication (GSM), General Packet Radio Service (GPRS), Universal Mobile Telephone Service (UMTS) and others. However, different communication standards may specify different carrier frequencies, different symbol rates and/or other parameters. Those parameters may have an effect on the requirements imposed on the interfaces between the respective subsystems. Accordingly, different interfaces may be required for different communication standards.

SUMMARY OF THE INVENTION

The present invention provides a wireless communication unit, a baseband module, a radio frequency module, a wireless terminal and a computer program product as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

DETAILED DESCRIPTION OF THE PREFERRED EMBODIMENTS

Figure 1:
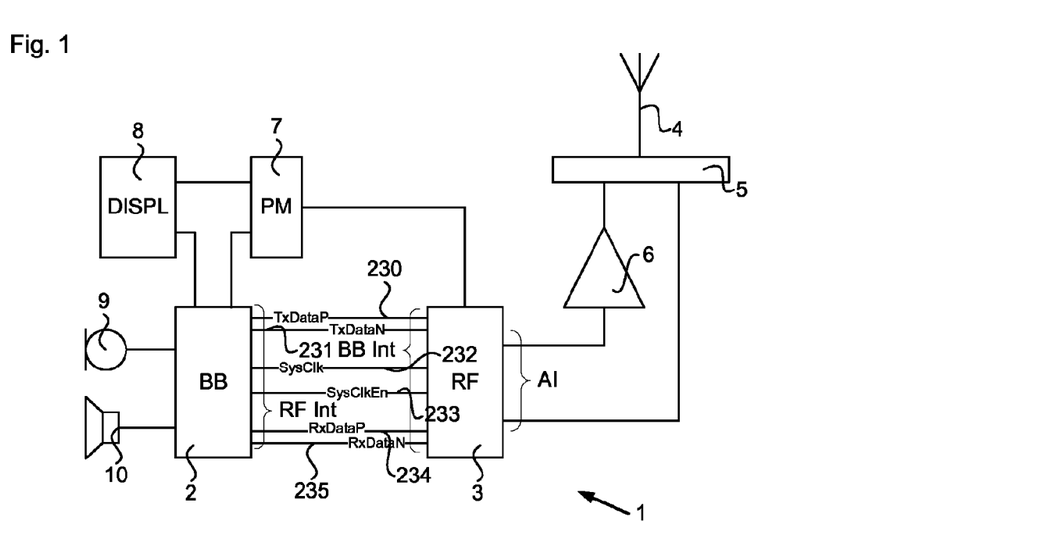
FIG. 1 schematically shows an example of an embodiment of a wireless communication device.

Referring first to FIG. 1, there is shown a simplified block diagram of part of a wireless communication device 1. The wireless communication device 1 may for example be a multimode mobile telephone or other wireless terminal which can be connected via a wireless connection to a (tele-)communications network in order to exchange data, video and/or speech. As shown, the wireless communication device 1 may contain a baseband (BB) module 2 and a radio frequency (RF) module 3. The BB module 2 may perform a number of data processing operations and/or signal processing operations at baseband frequencies. The radio frequency (RF) module 3 may perform a number of signal processing operations, such as converting baseband signals from or to RF signals, filtering signals and/or (de)modulating signals. A voltage regulator (not shown) associated with the RF module 3 may be part of a power management (PM) module 7, with the BB module 2 maintaining control of the power management (PM) module 7.

An antenna 4 may be coupled, via a 3G duplex filter and/or antenna switch 5, to an antenna interface AI of the RF module 3. RF signals may be received from and/or transmitted to a wireless communication channel at the antenna 4. The antenna switch 5 may provide isolation between receive and transmit chains within the wireless communication device 1.

The receiver chain may, as explained below in further detail while referring to the examples of FIGS. 2 and 3, include numerous receiver circuitries, from hereon commonly referred to as the RF receiving unit, on the RF module 3, such as receiver front-end circuitry providing reception, filtering and intermediate or baseband frequency conversion. The receiver chain may further include circuitry on the baseband device 2, from hereon commonly referred to as the baseband receiving unit for example to process baseband signals received from the RF module in order to output information, such as data, video and/or speech, represented by the signals in a for humans perceptible form, for example on output devices connected to the baseband device 2, such as at a display 8 or a speaker 10. The baseband signals may for example be digital signals which represent the inputted information (and optionally other information) in a digital form.

The transmit chain of the wireless communication device 1 may include one or more input devices, such as a microphone 9 and/or keypad (not shown), coupled to the BB module 2, via which information, such as data, video and/or speech, may be presented to the BB module 2.

The transmit chain may include circuitry in the BB module, from hereon commonly referred to as the baseband transmission unit, which generates baseband signals representing the information. The baseband signals may for example be digital signals which represent the inputted information (and optionally other information) in a digital form.

The transmit chain may further include circuitry in the RF module, from hereon commonly referred to as the RF transmission unit. The RF module in a transmit function may be coupled to a radio frequency power amplifier 6 and thereafter to the antenna 4, in this example via the antenna switch or duplex filter 340. Signals inputted at the input device may be processed by the BB module and be transmitted at baseband frequency to the RF module. The RF module may then convert the received baseband signals into signals at radio frequency which are suitable to be transmitted, optionally after being subjected to further operations such as power amplification, via the antenna 4, over a wireless connection.

As shown in FIG. 1, the RF module 3 may be communicatively connected to the BB module 2. The RF module may include a baseband interface BB Int at which signals can be outputted to the baseband module 2 and/or received from the baseband module 2. The baseband module 2 may include an RF interface RF Int at which signals can be outputted to the RF module 3 and/or received from the RF module 3.

As explained further below in more detail, the wireless communication unit 1 may have two or more different communication modes. In each of communication modes, the wireless communication unit 1 can communicate with a different type of wireless communication network.

The communication modes may be any communication mode suitable for the specific implementation.

For example, in the different communication modes, the wireless communication unit 1 may operate in manner compatible or complying with a different communication protocol. The communication protocol may for example be a telecommunication protocol, such as for instance a second generation (2G) mobile communication protocol such as CDMA or GSM, a 2.5G mobile communication protocol such as EGPRS, a $3^{rd}$ generation mobile communication protocol such as UMTS, or WCDMA, or a $4^{th}$ generation mobile communication protocol, such as Long Term Evolution (LTE), WiMax or WiBro. The communication protocol may for example be a data communication protocol such as for a wireless local area network or a metropolitan area network, for instance a protocol in the IEEE 802 series, such as the WiMax (Worldwide Interoperability for Microwave Access) or WiBro (Wireless Broadband) protocols. For instance, the communication modes may include modes in which the specific communication protocol complied with may include one or more of the group consisting of CDMA, EGPRS and WCDMA, WiMax, WiBro, LTE, WiFi, 802.11 series, (Wideband) Universal Serial Bus and future 4G standards.

A clock signal may be provided to the BB interface and/or the RF interface. The clock signal may have a clock rate as listed in table 1. Those skilled in the art will appreciate there may be an absolute tolerance for the variation of the clock rate of these clock sources. For example, the tolerance variation may be about 0.1% or less, such as 0.01% or less, for example 0.01‰ or less, such as 0.005‰ or less.

TABLE 1

| frequency |
|---|
| 921.6 MHz |
| 1013.76 MHz |
| 1105.92 MHz |
| 1198.08 MHz |
| 1290.24 MHz |
| 1382.4 MHz |
| 1474.56 MHz |
| 1566.72 MHz |
| 1658.88 MHz |
| 1751.04 MHz |
| 1843.2 MHz |
| 1935.36 MHz |
| 2027.52 MHz |
| 2580.48 MHz |
| 2672.64 MHz |
| 2764.8 MHz |
| 2856.96 MHz |
| 2949.12 MHz |
| 3041.28 MHz |
| 3133.44 MHz |
| 3225.6 MHz |
| 3317.76 MHz |

TABLE 1-continued

| frequency |
|---|
| 3409.92 MHz |
| 3502.08 MHz |
| 3594.24 MHz |
| 3686.4 MHz |
| 3778.56 MHz |
| 3870.72 MHz |
| 3962.88 MHz |

It is found that such a clock rate enables the RF module 3 and the baseband module 2 to operate in a large variety of networks. In particular it is found that in this range a large number of clock rates exists which are an integer multiple of the chip or symbol or sample rate specified by a variety of communication protocols (which are from hereon referred to as integer F protocols) and hence enables the generation of a clock signal suitable for an exchange of data at the specified symbol rate in a simple manner. For example, for WCDMA the chip rate is 3.84 Mega Chips per second (MChips/s), for CDMA 1.2288 MChips/s and for LTE either 30.72 MSamples/s, 23.04 MSamples/s or 15.36 MSsamples/s. Hence, for a clock signal with a rate of 2580.48 MHz a clock signal suitable for those symbol rates can be obtained by a simple integer division by 672, 2100, 84,112 or 168 respectively. Furthermore, it is found that for a large number of the integer F protocols, a clock rate in this range lies outside the range of carrier frequencies for the radio frequency signals, and hence may reduce the chance of interference between the clock signal and the carrier signal.

Additionally a clock rate in this range also lies outside the range of VCO (Voltage Controller Oscillator) frequencies used for Local oscillator (LO) frequency generation. Also, the Clock harmonics also lie outside the frequency operating range of the VCO used for LO generation. Hence interference between the clock signal and the VCO signal may be reduced. The VCO may for example operate at two or four times a local oscillator (LO) frequency. Thereby, an efficient quadrature signal generation apparatus may be constructed.

The baseband interface and the RF interface may be implemented in any manner suitable for the specific implementation. As shown in the examples, the RF interface RF Int and the baseband interface BB Int may for instance both include a number of pins, for instance six pins or eight pins, to carry electrical signals there between. The pins may for example be connected to different paths, such as a separate transmission path and receiving path and/lines. The paths may for instance include a differential transmission path including TxDataP line 230, TxDataN line 231, a differential receiving path including RxDataP line 234, and RxDataN line 235, a single ended SysClk line 232 and a single ended SysClkEn line 233. However, depending on the communication protocols to comply with, other pins and lines may be provided.

Figure 2:
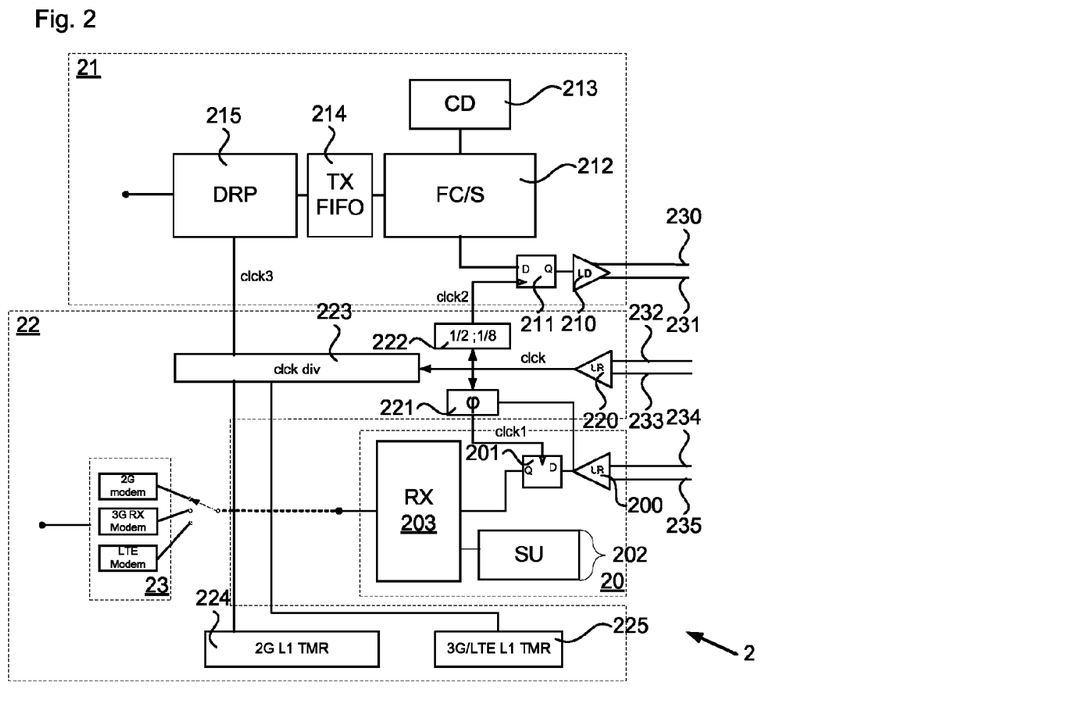
FIG. 2 schematically shows an example of an embodiment of a baseband module, which may be used in the example of FIG. 1.

Referring now to FIG. 2, a block diagram of a baseband module 2 is shown. As shown, the baseband module 2 may include a baseband transmission unit 21, for transmitting baseband signals to the RF module 3. The baseband module 2 may include a baseband receiving unit 20 for receiving signals from the RF module 3. The signals exchanged between the baseband interface and the radio frequency interface may for example be digital signals and hence represent binary data.

The baseband module 2 may further include a baseband timing unit 22, which together with an RF timing unit 31 in the RF module 3 forms a clock system. As shown in FIG. 2, the units 20-22 are connected to respective lines 230-235 at the RF interface of the baseband module 2, via which the units 20-22 can receive and/or output signals from/to the baseband interface of the RF module 3.

The unit 20-22 may, as shown in FIG. 2, include at the respective connection to the lines 230-235 a line driver 210 and line receivers 200, 220. In the timing unit 22 and the receiving unit 20, the line receivers 200,220 may be connected with an input to the respective lines and with an output to an input of a latch 201. In the transmitting unit 21, the line driver 210 may be connected with an output to the respective lines 230,231. An input of the line driver 210 may be connected to an output of a latch 211. In FIGS. 2 and 3, the latches are implemented as D-flip-flops. The latches synchronise the data presented at the latch input (denoted D in the figure) with a respective clock signal clck1,clck2 and output at the latch output (denoted Q in the figure) the data presented at the latch input synchronised with the clock signal clck1,clck2.

With respect to the receiving unit 20, the latch 201 may be connected to a receiving buffer 203 which can buffer the data received, via the latch 201, at the RF interface. The receiving buffer 203 may output the buffered data to a baseband modem unit 23 when a predetermined condition is fulfilled, for example when all the data of a data packet have been received in the buffer 203. The baseband modem unit 23 may include a selection mechanism for selecting a baseband modem suitable for the communication mode. As shown, the baseband modem 23 may be positioned, in a data processing direction, downstream of the receiving buffer 203 As shown in FIG. 2, the baseband modem unit 23 may for example include a 2G receiver modem, a 3G receiver modem and a LTE receiver modem.

As shown, the receiving buffer 203 may be connected to a selection unit 202 which can select settings suitable for the specific communication mode. For example, the selection unit 202 may control the oversampling mode, the number of bits per received sample of data or other suitable settings.

The transmission unit 21 may, as shown, include a data processing unit (DRP) 215 which may generate data to be transmitted via the wireless channel. The DRP 215 may be connected to a transmission (TX) buffer 214, which may for example be a first-in first-out (FIFO) buffer. The buffer 214 can buffer data transmitted by the DRP and output buffered data to a frame constructing and/or sequencing (FC/S) unit 212 which generates frames or packets compliant with the communication protocol of the respective communication mode. The FC/S unit 212 may be connected, in this example via the latch 211 and the line driver 210, with an output to the transmission line at the RF interface. A control input of the FC/S device may be connected to a control unit 213 which can control settings of the frame construction and sequencing performed by the FC/S device 212. For example, the control unit 213 may control frame lengths depending on the mode, the number of bits per chip, symbol or chip or other suitable parameters of the FC/S device.

Figure 3:
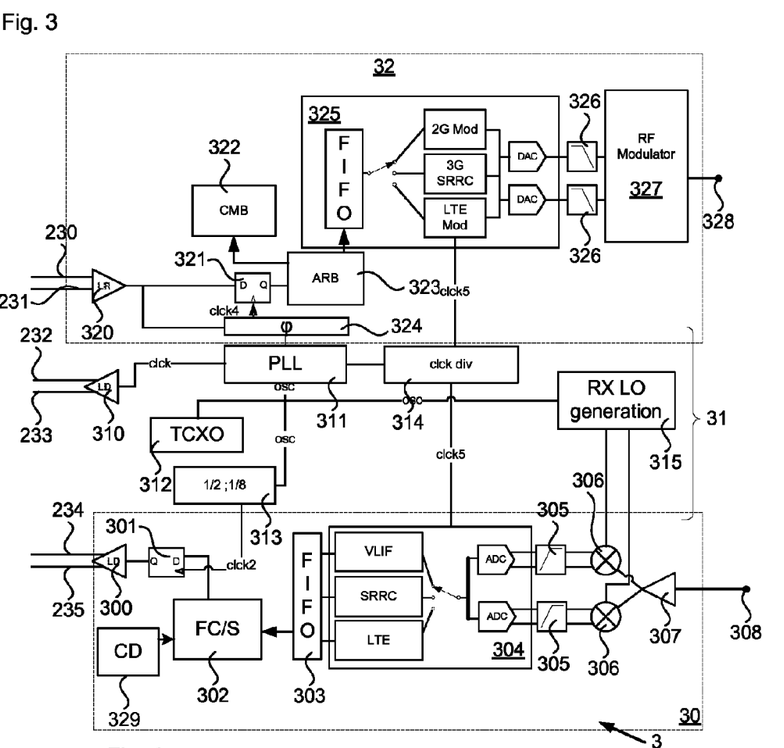
FIG. 3 schematically shows an example of an embodiment of a radiofrequency module, which may be used in the example of FIG. 1.

Referring to FIG. 3, the RF module 3 may include a RF transmission unit 32, for transmitting, via the antenna 4, data received from the baseband module 2 to the wireless connection. The RF module 3 may further include a RF receiving unit 30 for receiving, via the antenna 4, data from the wireless connection and transmitting the received signals to the baseband module 2. The RF module 3 may further include an RF timing unit 31.

As shown in FIG. 3, the units 30-32 are connected to respective lines 230-235 at the baseband interface of the RF module 3 via which the units 30-32 can receive and/or output signals from/to the baseband module 2. The receiving unit 30 and the transmission unit 32 are further connectable via a receiver contact 308 and a transmitter contact 328 respectively to the antenna 4. The units 30-32 may, as shown, include respective lines drivers 300,310 and line receiver 320 connected to the paths 230-235 between the baseband interface and the RF interface.

The RF receiving unit 30 may include a frequency converting unit 306. The frequency converting unit 306 may convert the frequency of the received signals, in this example by mixing the incoming signals with a local oscillator (LO) signal. As shown, a low noise amplifier (LNA) 307 may connect the frequency converting unit 306 to the receiver contact 308 in order to input signals received at the contact 308 into the frequency converting unit 306. As shown in FIG. 3, the frequency converting unit 306 may for instance include a quadrature mixer which may be connected to a source 315 of LO signals. In this example, the source 315 generates the LO signals based on an oscillator signal (osc) received from an oscillator 312, in this example a temperature compensated oscillator (TCXO). The oscillator 312 may for example provide an oscillator signal of a frequency which may be an integer multiple of a clock rate for the communication between the baseband interface and the RF interface in at least one of the communication modes. For instance, the oscillator 312 may provide a signal of about 52 MHz and the clock rate may be 2496 MHz in an EGPRS (Enhanced Data rates for GSM Evolution) communication mode or other 2G or 3G communication modes. It is found that for a large number of communication protocols, especially 2G and 3G telecommunication protocols, the clock rates can be obtained from a signal with a clock rate of substantially 2496 MHz by a simple integer division.

The frequency converting unit 306 may be connected via a filter unit 305 to a receiving block 304. The receiving block 304 can digitize the frequency converted signals and digitally filters the digitized signals. The receiving block 304 may for example include an analogue-to-digital converting unit (ADC) which can receive the frequency converted signals. The ADC may be connected to a selected digital filter corresponding to the used communication mode which may be selected from one or more digital filters present in the RF module. As shown in FIG. 3, for example, the ADC may be connected via a selection unit to a selected digital filter, while the receiving block 304 may include a very low intermediate frequency filter (VLIF) suitable for a 2G communication mode, a Square Root Raised Cosine (SRRC) filter for a 3G communication mode and a filter for long term evolution mode.

The output of the receiving block 304 may be connected to a buffer 303 which in turn may be connected to a frame constructing and/or sequencing (FC/S) unit 302. The FC/S unit 302 may be connected with its output to a latch 301 which synchronises the data outputted by the FC/S unit 302, with a clock signal clck2. The FC/S unit 302 may be connected to a control unit 329 which can control settings of the frame construction and sequencing performed by the FC/S device 302

The transmission unit 32 may include a latch 321 which may be connected to the line receiver 320. The latch 321 synchronises the data received at the RF interface with a clock signal clck4 and outputs the synchronised data to a message arbitration (ARB) unit 323. For instance, in case the communication protocol is a packet or frame based protocol, the ARB unit 323 may extract header information from the payload of data packets or frames. The ARB unit 323 may decide if the payload data is control data or transmitted data. The ARB 323 may be connected to a control message bus (CMB)

322. The ARB units 323 may pass the control data to the CMB 322, based on which the CMB may control the settings of control functions.

The ARB 323 may be connected with its output to a transmission unit 325. The ARB 323 may for example pass transmission data to the transmission unit 325, for instance to a first-in first out (FIFO) buffer. The transmission unit may digitally modulate the data outputted by the ARB 323 and converts the digitally modulated data into analogue signals. As shown in FIG. 3, the transmission unit 325 may include a buffer FIFO connected to the ARB 323. The buffer may output buffered data to a selected digital modulation unit corresponding to the used communication mode, which may be selected from one or more digital modulation units present in the RF module 3. As shown in FIG. 3, for example, the buffer may be connect a selection unit to a selected digital modulation unit, while the transmission block 325 may include a 2G modulator suitable for a 2G communication mode, a Square Root of Raised Cosine (SRRC) filter for a 3G communication mode and an LTE modulator for a long term evolution mode.

The output of the selected modulator may be connected to a digital to analog conversion section in the transmission unit, which outputs analog signals to a low pass filter unit 326. The low-pass filter unit 326 filters the analog signals and inputs the filtered signals into an RF modulator 327 which, inter alia converts the frequency of the filtered signals into an RF frequency, using a suitable analogue modulation technique, such as frequency modulation, phase modulation, amplitude modulation or a combination thereof. The RF modulator 327 may, as shown, be connected to the antenna 4, e.g. via the power amplifier 6 and/or the antenna switch 5.

The clock rate of the exchange of data between the radio frequency interface and the baseband interface may be controlled in any manner suitable for the specific implementation. The RF interface and the baseband interface may for instance be connectable to the same clock system. The interfaces may receive from the clock system a common clock signal from which the clocks of the RF interface and the baseband interface are derived, and hence which common clock signal controls the clock rates. Thereby, the amount of components in the wireless communication device 1 may be reduced. Referring to FIGS. 2 and 3, for instance the timing units 22,31 generate the interface clock signals clck1-clck5 supplied to the interfaces based on a common clock signal, and hence the RF interface and the baseband interface are connected to the same clock system. As explained below, the interface clock signals clck1-clck5 may have a clock rate different from the common clock clck and be derived from the common clock clck, for example by integer division of the clock rate.

As shown in FIGS. 2 and 3, for example, the common clock source of the common clock signal may be included in the radio frequency module 3. In another embodiment, the common clock source may be included in the BB module 2. As shown in the examples of FIGS. 2 and 3, the common clock source may include an oscillator 312 and frequency synthesizer 311. The oscillator 312 is connected to an input of the frequency synthesizer and may input an oscillator signal 'osc' in the frequency synthesizer. The frequency synthesizer 311 may synthesize a signal with a frequency which is a multiple of the frequency of the inputted signal, such as an integer multiple or a fractional multiple thereof, e.g. the output frequency $f_{out}$ may be have a relationship with the input frequency $f_{in}$ as can be described by the mathematical formula $f_{out}=f_{in}*(F+1/k)$, with F being integer values and the value $F+1/k$ being referred to as the synthesizing ratio. The clock rate clck may be changed by modifying F and k, as represented with arrows 3116 and 3317 respectively in FIG. 4.

Figure 4:
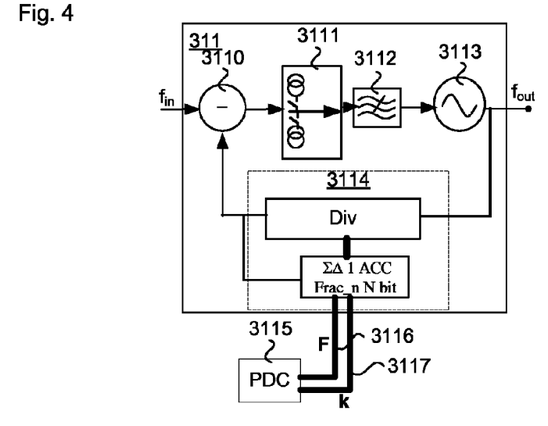
FIG. 4 schematically shows an example of a phase locked loop, which may be used in the examples of FIGS. 2 and 3.

The clock system may have two or more different clock generation modes for generating clock signals with two or more different clock rates and may include a clock mode selection unit connected to a control input of the clock system, for selecting a clock generation mode. For instance, the frequency synthesizer 311 may have an adjustable synthesizing ratio. As shown in FIG. 4, for instance, the synthesizer 311 may be implemented as a phase and/or frequency locked loop (PLL). The shown example of a PLL may include, in a signal processing direction, a phase detector 3110, a charge pump 3111, a filter 3112 and a voltage controlled oscillator (VCO) 3113. As shown, the output of the VCO is fed back into the phase detector 3110 via a divider 3114 which divides the frequency $f_{out}$ of the outputted signal with a fixed ratio $F+1/k$. It will be appreciated that since PLLs are generally known in the art, for sake of brevity the operation thereof will not be described in further detail. However, it will be apparent that the charge pump and/or the filter 3112 and/or the divider 3114 may be omitted and that instead of a VCO another variable oscillator may be used. As shown in the example of FIG. 4, the divider 3114 may for example include an integer divider path DIV which can divide the frequency with an integer value and a fractional divider path, in this example implemented as a ΣΔ fractional divider, which can provide a division of the frequency with a non-integer value.

As shown in FIG. 4, a control input of the divider 3114 may be connected to a programmable clock divider (PDC) 3115 which can adjust the divider ratio based on the communication mode. The PDC may for example outout control signals F 3116 and k 3117 which control the integer division F and the fractional division 1/k and hence control the divider ratio of the divider in the PLL 311

The programmable clock divider may also control the divider ratio based on other parameters, and for example control the divider ratio, and hence the clock generation mode, based on a determined geographic location of the wireless communication unit and/or control the division ration based on the communication mode.

The components in the RF module 3 and/or the BB module 2 may be provided by the respective timing unit 22,31 with a clock signal clck1-clck5 derived from the common clock signal clck. For example, the unit 1 may include one or more clock converters which can receive the common clock signal and output an interface clock signal clck1-clck5 which has a clock rate different from the clock rate of the common clock clck.

As shown in FIG. 2, for instance, the baseband timing unit 21 may for example include a clock rate dividing unit 222 which can divide the clock rate of the common clock signal clck by an integer value, e.g. 2 or 8, in order to obtain a symbol rate for the transmission from the RF interface to the baseband interface which conforms with the protocol according to which the system 1 in the respective communication mode. For instance, for a WiMax or LTE communicating mode, the common clock signal clck, with a clock rate of 2580.48 MHz may be divided by 2, whereas for EGPRS the clock rate of the common clock signal clck may be set to e.g. 2496 MHz and be divided by 8. The clock rate dividing unit 222 may provide a divided clock signal clck2 to the baseband transmission unit 21. In the example of FIG. 2, the clock rate dividing unit 222 is connected, via the line receiver 220 to the clock line and receives the common clock from the RF module 3 and is connected to the latch 211, in order to input the divided clock signal clck2 into the latch 211. It should be noted that the receiving unit 30 in the RF module has a clock rate dividing unit 313 connected to the latch 301 which performs the same function as the clock rate dividing unit 222 with respect to the clock rate for data transmitted from the RF module 3 to the baseband module 2.

As shown in FIGS. 2 and 3, the timing units 22,31 may include clock phase selection units 221,324 connected to the baseband receiving unit 20 and the RF transmission unit 32 respectively. The clock phase selection units 221, 324 may select a clock phase, for example out of a number of possible clock phases to use to sample the data from the Line receiver via the latches 201,321 correctly and to present data to the Line Driver via dividers 222, 313 and latches 211,301. In the examples, the clock phase selection units 221, 324 (the unit pick the most suitable clock phase) are connected to the clock inputs of the latches 201,321 and can provide a phase selected clock signal clck1,clck4 to the latches 201,321, to which the signal inputted to the respective latch 201,321 is synchronised.

The baseband module 2 and/or the RF module 3 may further include clock dividers (clck div) 223, 314 which can divide the clock rate of the common clock signal clck with a fractional or integer value, for example to provide an divided clock signal clck3 to a data processing unit 215, to communication protocol specific timers 224,225 or to provide a divided signal clck 5 to the transmission block 325 or the receiver block 304 in the RF module. The period of a divided clock signal may for example correspond to the period of a bit, symbol, chip specified by a variety of communication protocols.

For example, for one or more of the communication modes the clock rate may lie outside a carrier frequency band of the radio frequency signals and the clock mode selection unit. In the example of FIG. 3 the F and k values may be configured by providing the control signals 3116,3317 to switch the clock system to another clock generation mode with a different clock rate, e.g. different from 2580.48 MHz when the clock rate lies in the carrier frequency band for one or more communication mode. Also for example, for one or more of the communication modes, the clock rate may deviate from a clock rate in accordance with the specific data communication protocol and lie within an allowed margin of deviation specified by the specific data communication protocol by modifying the values provided to the PLL 311 by the PDC 3115.

For instance, for an EGPRS communication mode the symbol rate specified by the EGPRS protocol is 270833.3 Symbols per second (kS/s). Accordingly, the integer multiple thereof closest to 2580.48 GHz is 2580.50 GHz, which is a difference of 7.75 parts per million and within the margin of deviation expected by mobile terminal designs for the EGPRS protocol. Hence, by integer dividing (e.g. by 9528) a clock signal with a clock rate of 2580.48 GHz a clock with a rate suitable for driving a EGPRS transmission can be obtained.

Depending on the different communication modes, the clock rate of 2580.48 MHz which is suitable for LTE, CDMA, WCDMA as it allows for integer interpolation and decimation may for instance deviate less than 5%, such as 3% from the initial clock rate of 2580.48 MHz in order to accommodate other protocols such as WiMax, WiBro. For example, WiMax WiBro compatibility can be achieved from changing the clock rate by 3% from 2584.48 MHz to 2520 MHz which allows WiMAX and WiBro integer interpolation and decimation. The clock rate clck may for example be changed in the shown example by modifying the integer values F and the fractional value k provided by the PCD 3115 into the divider pf the PLL 3114.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program product, may for instance include program code portions loadable in a memory of a system, device or terminal, which when executed set or control a clock rate for data exchange between a baseband interface and a radio frequency interface to be approximately 2.58 GHz. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-ROM or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections. Furthermore, where numerical values are mentioned, it will be apparent that these may be varied within the 312 MHz to 4 GHz range. Furthermore, for example, in FIGS. 2 and 3, for sake of simplicity only a single receiver path to the antenna(e) and a single transmit path to the antenna(e) are shown. However it will be appreciated that more transmit and receive paths, (and components such as the LNA 307 connected to the contacts) may be present, for example to provide signals or receive signals from different bands and/or antenna.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, the clock circuit may be provided on a different piece of silicon than the receiving units 20, 30 or the transmission units 21, 32. Also, devices functionally forming separate devices may be integrated in a single physical device. For example, the RF module and the baseband module may be provided as a single integrated circuit package.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. A wireless communication unit, comprising:
a baseband module and; a radio frequency module,
said baseband module including a radiofrequency interface connected to said radio frequency module, for receiving and/or transmitting baseband signals from and/or to said radio frequency module,
said radiofrequency module including:
a baseband interface, connected to said radiofrequency interface for receiving and/or transmitting said baseband signals to said baseband module;
said wireless communication unit having at least two communication modes including at least one mobile phone mode, in which mobile phone mode said wireless communication unit transmits or receives wireless signals via said antenna from and/or to a mobile phone network in accordance with a communication protocol;
wherein said wireless communication unit further includes:
a clock system connected to said radio frequency interface and said baseband interface, said clock system being configured to provide, in operation, a clock signal to said radio frequency interface and said baseband interface in each of said at least two communication modes, said clock signal within a tolerance of variation of 0.1% of a clock rate selected from the group consisting of: 921.6 MHz, 1013.76 MHz, 1105.92 MHz, 1198.08 MHz, 1290.24 MHz, 1382.4 MHz, 1474.56 MHz, 1566.72 MHz, 1658.88 MHz, 1751.04 MHz, 1843.2 MHz, 1935.36 MHz, 2027.52 MHz, 2119.68 MHz, 2211.84 MHz, 2304 MHz, 2396.16 MHz, 2488.32 MHz, 2580.48 MHz, 2672.64 MHz, 2764.8 MHz, 2856.96 MHz, 2949.12 MHz, 3041.28, MHz, 3133.44 MHz, 3225.6 MHz, 3317.76 MHz, 3409.92 MHz, 3502.08 MHz, 3594.24 MHz, 3686.4 MHz, 3778.56 MHz, 3870.72 MHz, and 3962.88 MHz, wherein said clock rate and harmonics at integer multiples thereof lie outside a voltage controlled oscillator (VCO) range for local oscillator (LO) generation for the wireless signals for each of said at least two communication modes.

2. A wireless communication unit as claimed in claim 1, wherein said clock system includes:
a common clock source for providing a common clock signal, said common clock signal having said clock rate in at least one of said at least one mobile phone modes; and
wherein said RF interface and/or said baseband interface include at least one clock converter connected to said common clock source, for receiving said common clock signal and generating an interface clock signal, derived from said common clock signal, said interface clock signal having a interface clock rate different from said clock rate.

3. A wireless communication unit as claimed in claim 2, wherein said radio frequency module includes said common clock source.

4. A wireless communication unit as claimed in claim 2, wherein said common clock signal has a clock rate which is an integer multiple of the interface clock rate of said interface clock signal.

5. A wireless communication unit as claimed in claim 1, wherein said clock system includes a programmable clock divider unit for adjusting said clock rate to another clock rate depending on one of more of: the communication mode, the geographical location of the wireless communication unit, the carrier frequency bands of the radio frequency signals.

6. A wireless communication unit as claimed in claim 1, wherein said clock rate lies outside a carrier frequency band of the radio frequency signals for at least one of said communication modes.

7. A wireless communication unit as claimed in claim 1, wherein, for at least one of said communication modes, said clock rate deviates from a clock rate specified by said specific communication protocol and
lies within an allowed margin of deviation specified by said specific communication protocol.

8. A wireless communication unit as claimed in claim 1, wherein said clock rate of is an integer multiple of a symbol rate of a specific communication protocol of at least one of said modes.

9. A wireless communication unit as claimed in claim 1, wherein said specific communication protocol includes one or more of the group consisting of:
CDMA, EGPRS and WCDMA, WiMax, WiBro, LTE, 802.11 series, and WiFi protocols.

10. A baseband module for a system as claimed in claim 1.

11. A radio frequency module for a system unit as claimed in claim 1.

12. A wireless terminal, including a system or device unit as claimed in claim 1.

13. A wireless communication unit as claimed in claim 3, wherein said common clock signal has a clock rate which is an integer multiple of the interface clock rate of said interface clock signal.

14. A wireless communication unit as claimed in claim 2, wherein said clock system includes a programmable clock divider unit for adjusting said clock rate to another clock rate depending on one of more of: the communication mode, the geographical location of the wireless communication unit, the carrier frequency bands of the radio frequency signals.

15. A wireless communication unit as claimed in claim 2, wherein said clock rate lies outside a carrier frequency band of the radio frequency signals for at least one of said communication modes.

16. A wireless communication unit as claimed in claim 2, wherein said clock rate of is an integer multiple of a symbol rate of a specific communication protocol of at least one of said modes.

17. A computer program product in a non-transitory computer-readable medium, including program code portions loadable in a memory of a system, device or terminal, which when executed set or control, within a tolerance of variation of 0.1%, a clock rate of a clock signal for data exchange between a baseband interface of a radiofrequency module and a radiofrequency interface of a baseband module selected from the group consisting of: 921.6 MHz, 1013.76 MHz, 1105.92 MHz, 1198.08 MHz, 1290.24 MHz, 1382.4 MHz, 1474.56 MHz, 1566.72 MHz, 1658.88 MHz, 1751.04 MHz, 1843.2 MHz, 1935.36 MHz, 2027.52 MHz, 2119.68 MHz, 2211.84 MHz, 2304 MHz, 2396.16 MHz, 2488.32 MHz, 2580.48 MHz, 2672.64 MHz, 2764.8 MHz, 2856.96 MHz, 2949.12 MHz, 3041.28 MHz, 3133.44 MHz, 3225.6 MHz, 3317.76 MHz, 3409.92 MHz, 3502.08 MHz, 3594.24 MHz, 3686.4 MHz, 3778.56 MHz, 3870.72 MHz, and 3962.88 MHz, wherein said clock rate and harmonics at integer multiples thereof lie outside a voltage controlled oscillator (VCO) range for local oscillator (LO) generation for wireless signals for each of at least two communication modes, including at least one mobile phone mode, in which mobile phone mode said wireless signals are transmitted and/or received to and/or from a mobile phone network, wherein said baseband interface is connected to said radiofrequency interface, said baseband interface for receiving and/or transmitting said baseband signals from and/or to said baseband module, and said radiofrequency interface for receiving and/or transmitting said baseband signals from and/or to said radiofrequency module, wherein said clock signal is provided, in operation, in each of said at least two communication modes, to said radiofrequency interface and said baseband interface by a clock system connected to said radiofrequency interface and said baseband interface.

18. A method for wireless communication, comprising: receiving at a radiofrequency interface of a baseband module baseband signals from a radiofrequency module and/or transmitting baseband signals from said radiofrequency interface to said radiofrequency module; transmitting from a baseband interface (BB Int) of said radiofrequency module said baseband signals to said radiofrequency interface and/or receiving at said baseband interface said baseband signals from said radiofrequency interface; receiving and/or transmitting radiofrequency signals over an radiofrequency channel at an antenna interface of the radiofrequency module from and/or to a mobile phone network; providing to said radiofrequency interface and said baseband interface a clock signal, said clock signal within a tolerance of variation of 0.1% of a clock rate selected from the group consisting of: 921.6 MHz, 1013.76 MHz, 1105.92 MHz, 1198.08 MHz, 1290.24 MHz, 1382.4 MHz, 1474.56 MHz, 1566.72 MHz, 1658.88 MHz, 1751.04 MHz, 1843.2 MHz, 1935.36 MHz, 2027.52 MHz, 2119.68 MHz, 2211.84 MHz, 2304 MHz, 2396.16 MHz, 2488.32 MHz, 2580.48 MHz, 2672.64 MHz, 2764.8 MHz, 2856.96 MHz, 2949.12 MHz, 3041.28 MHz, 3133.44 MHz, 3225.6 MHz, 3317.76 MHz, 3409.92 MHz, 3502.08 MHz, 3594.24 MHz, 3686.4 MHz, 3778.56 MHz, 3870.72 MHz, and 3962.88 MHz, wherein said clock rate and harmonics at integer multiples thereof lie outside a voltage controlled oscillator (VCO) range for local oscillator (LO) generation for the wireless signals for each of at least two communication modes, including at least one mobile phone mode, in which mobile phone mode said wireless signals are transmitted and/or received to and/or from said mobile phone network, wherein said baseband interface is connected to said radiofrequency interface, wherein said clock signal is provided, in operation, in each of said at least two communication modes, to said radiofrequency interface and said baseband interface by a clock system connected to said radiofrequency interface and said baseband interface.

* * * * *